(12) United States Patent
Menon et al.

(10) Patent No.: US 6,218,858 B1
(45) Date of Patent: Apr. 17, 2001

(54) PROGRAMMABLE INPUT/OUTPUT CIRCUIT FOR FPGA FOR USE IN TTL, GTL, GTLP, LVPECL AND LVDS CIRCUITS

(75) Inventors: Suresh Manohar Menon, Sunnyvale; Yogendra Kumar Bobra, San Jose; Atul V. Ghia, San Jose; Arch Zaliznyak, San Jose, all of CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/238,207

(22) Filed: Jan. 27, 1999

(51) Int. Cl.[7] .................... H03K 19/177; H03K 19/175
(52) U.S. Cl. .................................. 326/39; 326/62
(58) Field of Search .................. 326/37, 39, 44, 326/45, 47, 80–83, 86, 62, 63

(56) References Cited

U.S. PATENT DOCUMENTS

| | | | |
|---|---|---|---|
| 5,877,632 | * | 3/1999 | Goeting et al. ................ 326/50 |
| 5,977,795 | * | 11/1999 | Lee ............................ 326/70 |
| 6,005,414 | * | 11/1999 | Reay ........................... 326/83 |
| 6,049,227 | * | 4/2000 | Goetiing et al. ................ 326/80 |
| 6,052,014 | * | 4/2000 | Maeda .......................... 327/33 |

\* cited by examiner

*Primary Examiner*—Michael Tokar
*Assistant Examiner*—James H Cho
(74) *Attorney, Agent, or Firm*—Ronald C. Fish, Esq.; Edel M. Young (57) ABSTRACT

A programmable input/output structure comprised of three input circuits and one output circuit coupled to the pin of an FPGA with the input circuits and output circuits being selectively enabled by programming bits so that input signals may be accepted from TTL, GTL, GTLP, LVPECL or LVDS type external circuits. The programming bits can also selectively enable an output driver to simultaneously drive the same pin of the FPGA as an output with signals which are either TTL or GTL or GTLP compatible. Further, the slew rate of the output driver is programmable between slow, medium or fast.

5 Claims, 8 Drawing Sheets

LPECL/LVDS INPUT CIRCUIT

FIG. 5

AGTL,HSTL,SSTL DRIVER

FIG. 8
TTL INPUT CKT

FIG. 9

FIG. 10
LPECL/LVDS INPUT CKT

ENABLE AND SLEW RATE CONTROL LOGIC 400

PROGRAMMABLE INPUT/OUTPUT CIRCUIT FOR FPGA FOR USE IN TTL, GTL, GTLP, LVPECL AND LVDS CIRCUITS

FIELD OF USE

The invention is useful in the field of FPGA designs, and, more particularly, in FPGAs that are to be used in circuits where input signals may be received from TTL, GTL, GTLP, LVPECL or LVDS circuits or which may have to drive TTL, GTL or GTLP circuits.

FPGAs frequently are used to implement certain functions in other circuits and to provide flexible functionality. However, the number of potential applications for FPGAs is huge so FPGAs will be called upon in various applications to receive input signals from a large variety of different types of circuits having different voltage swing standards between logic 1 and logic 0. Likewise, FPGAs will be called upon in various applications to drive a variety of different types of circuits with output signals which must meet the standards of voltage level for logic 1 and logic 0 of the driven circuit.

Prior art FPGAs have difficulty adapting to use in different applications with circuits driving their input pins with voltage levels which are different than the voltage levels for which the circuitry inside the FPGA was designed for. Likewise, prior art FPGAs have difficulty driving circuitry that require input signals with logic levels which have different voltages than the voltage levels the FPGA is designed to generate. Prior to this invention, only one I/O standard had been offered for FPGAs. That standard was a CMOS I/O which was TTL compatible with slew rate control. This means that the output is CMOS but the logic swings are TTL compatible with some programmability of slew rate control. However, there are other logic families for CMOS and TTL, and new families are being developed. Other families include GTL, GTLP, LVPECL and LVDS. Each of these other families has different requirements for logic 0 and logic 1 voltage levels, voltage reference levels, offset and/or swing. Prior art FPGA CMOS I/O circuits either have difficulty being compatible with these diverse standards or require external conversion circuitry to be compatible.

Thus a need has arisen for an FPGA with a programmable I/O circuit which can accept input signals from many different types of logic families and complying with their native standards and which can drive circuits from different logic families in accordance with their diverse standards.

SUMMARY OF THE INVENTION

The genus of the invention includes any programmable circuitry that can be configured with programming bits to assume any one of the configurations given in FIGS. 1 through 6 or any other FPGA driver or input circuits already existing or developed in the future to drive signals to external circuits off the FPGA or receive signals into the FPGA from off-chip circuits in new technology families already developed, in the process of development or to be developed in the future. Essentially, the invention is a programmable I/O circuit for an FPGA which, by changing some programming bits, can be transformed into any one of the FPGA driver or input circuits shown in FIGS. 1–6 or any other currently existing input circuit or driver for an FPGA which currently exists but is not supported by the products of the assignee or which is developed in the future. Essentially, the details of the actual input circuits themselves or drivers themselves on board the FPGA are not important since these circuits are already known or will become known in the future. It is the programmability to transform a programmable input circuit or driver from an input circuit or driver compatible with a first technology family to an input circuit which is compatible with a second technology family or any other logic family that is the essence of what is new. The exact details of how the programmability is achieved are not critical, so long as the FPGA I/O circuit is programmable so as to be compatible with existing or future developed off chip technology families.

A subgenus within this main genus includes programmable slew rate. This is achieved by having multiple parallel transistors either with different channel widths which may be substituted or by having multiple parallel transistors all with the same channel width which may be added in parallel to add additional current sinking or current sourcing capability to alter the slew rate.

DETAILED DESCRIPTION OF THE PREFERRED AND ALTERNATIVE EMBODIMENTS

CMOS FPGAs that need to be used with other circuit families must be able to receive input signals at the voltage levels generated by those circuits or generate output signals that those other circuit families are compatible with. For example, the TTL family standards are: logic 0=0.4 volts (hereafter V), logic 1=2.4 V and the reference voltage is 1.3 V–1.5V. The GTL logic family standard is an open drain family: logic 0=0.4 V, logic 1=1.2 V and the reference voltage is $\frac{2}{3}$ $V_{TT}$ where $V_{TT}$ is 1.2 V and a load resistance of 50 ohms is required. The GTLP logic family standard is: logic 0=0.55 V, logic 1=1.5 V and the reference voltage is $\frac{2}{3}$ $V_{TT}$ where $V_{TT}$ is 1.5 V and a load resistance of 25 ohms is required. The LVPECL (Vcc=3.3 volt positive supply, emitter coupled logic) single ended and differential logic family standard is: logic 0=Vcc–1.7 V, logic 1=Vcc–0.8 V and the reference voltage is Vcc−1.3 V. The LVDS or low voltage differential signalling family is a CMOS technology requiring an offset of 1.2 V and a logic swing of 345 millivolts between the logic 0 and logic 1 levels.

The GTL (Gunning transistor logic which is like ECL in CMOS) and GTLP or GTL Plus standards were developed in an effort to get more speed out of CMOS circuitry. Still newer logic families such as AGTL, HSTL 1, 2, 3 or 4 and SSTL are also either currently in existence or being developed in an attempt to get still more speed out of CMOS. The AGTL family is being developed by Intel and stands for assisted GTL. This technology is essentially a combination of the circuits of FIGS. 1 and 2 to add a P-channel device to the circuit of FIG. 2 to assist pullup of the voltage on node 42 to make it faster. Newer technologies will continue to be developed, so the importance of programmable I/O circuits that can drive different technology families or receive input signals therefrom will become ever more important.

The I/O circuitry disclosed herein for an FPGA according to the invention is programmable to receive input signals from or drive output signals to any of the TTL, GTL or GTLP families and can receive input signals from the LVPECL or LVDS families. Other circuitry suitable to programmably drive TTL, GTL, GTLP, LVPECL or LVDS circuits will be apparent to those skilled in the art given their knowledge of the art and the guidance given herein as to specific circuits to drive TTL, GTL or GTLP circuits or receive inputs from TTL, GTL or GTLP as well as LVPECL or LVDS circuits. The I/O circuitry inside the FPGA coupled to each pin can be programmed individually such that the FPGA can receive input signals at a particular pin from any of the TTL, GTL, GTLP, LVPECL or LVDS families and drive output signals to any of the TTL, GTL or GTLP families such that the FPGA can act as a level translator and conversion circuit between diverse logic families. Each FPGA output has programmable slew rate control and has 3-state capability. When set to TTL mode, the FPGA I/O circuits according to the invention are 100% compatible with 33 MHz and 66 MHz PCI busses.

In the preferred embodiment, four separate and different programmable I/O circuits are used to support the five logic families: TTL, GTL, GTLP, LVPECL and LVDS. The first programmable input circuit receives input from TTL family off chip circuits. The second programmable input circuit receives input from GTL and GTLP off chip circuits. The third programmable input circuit receives input only from the LVPECL and LVDS logic families. A fourth programmable output circuit generates output signals for either TTL or GTL or GTLP off chip circuits at the same pin or pad that input data is received on. Most of the FPGA pins have both programmable input circuits and programmable output circuits present and connected to the same pin so that input signals can be received from all five logic families or output signals can be generated which are compatible with the TTL, GTL or GTLP families. Others of the pins have only the first type programmable I/O circuit or the second type programmable I/O circuit present so not all logic families can be supported at all pins. In other embodiments, all I/O pins will have both types of programmable I/O circuits so that any pin can support all five logic families.

To best understand the characteristics that the programmable I/O circuits must have to be compatible with a plurality of logic families, it is best to start with the individual driver circuits and individual input circuits for each logic family which would have to be present inside an FPGA to be able to drive output signals to a particular logic family with compatible voltage levels or receive input signals from a circuit in a particular logic family and convert them to the voltage levels used inside the FPGA for logic 1 and logic 0. The internal logic of the FPGA will be assumed to be CMOS. Specific programmable circuits will be taught herein which can programmably perform the functions of any one of the drivers or input circuits disclosed below in FIGS. 1–6, but those skilled in the art will appreciate other circuits which also may be used to programmably "masquerade" or perform the equivalent functions of any of the drivers and input circuits disclosed in FIGS. 1–6 given the example detailed herein without departing from the spirit and scope of the invention.

Figure 1:
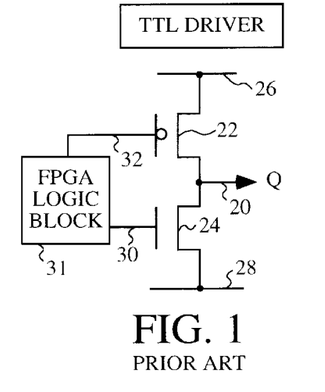
FIG. 1 is a circuit diagram of an FPGA driver known in the prior art that can drive TTL circuits.

FIG. 1 is a diagram of a typical prior art CMOS TTL driver that has been used in FPGAs in the prior art to generate TTL level output signals at output pin 20. The driver is comprised of a pair of CMOS transistors including a P channel device 22 and an N channel device 24 coupled in series between high and low rails 26 and 28. The channel sizes of the transistors 22 and 24 are selected to establish the required current drive capacity to meet the required slew rate. To generate a logic 1, the FPGA logic block 31 generates a logic 0 on each of lines 30 and 32. To generate a logic 0, the logic block 31 generates a logic 1 on both of lines 30 and 32. To tristate the output, the logic block generates true and complement signals on lines 30 and 32 such that both CMOS transistors 22 and 24 are turned off. These logic signals control the conductivity states of transistors 22 and 24 such that either transistor 22 is on and transistor 24 is off thereby coupling line 20 to the high rail 26, or transistor 24 is on and transistor 22 is off thereby connecting line 20 to low rail 28. The voltages on the high and low rails are such that the logic swing on output pin 20 is compliant with TTL standards. The FPGA logic block is usually connected to lines 30 and 32 through programmable "active links" such as are defined in co-pending U.S. patent application Ser. No. 08/978,691, filed Nov. 26, 1997 which is hereby incorporated by reference. An active link is a programmable connection circuit which selectively connects line segments of the same line in a bus using an MOS or bipolar transistor such that gain is supplied to reconstruct the signal such that the losses are replenished and the signal is reconstructed. The active link also serves to compartmentalize the parasistic capacitances affecting the line segments such that drivers connected to each line segment can be optimized for the parasitic capacitances on that line segment alone and subsequent routing decisions do not affect the amount of parasitic capacitance the driver must contend with. Active links are not necessary to practice the invention of course and any other prior art structure for selectively connecting logic blocks to pins in FPGAs such as fusible links etc. may be substituted and are deemed equivalent.

Figure 2:
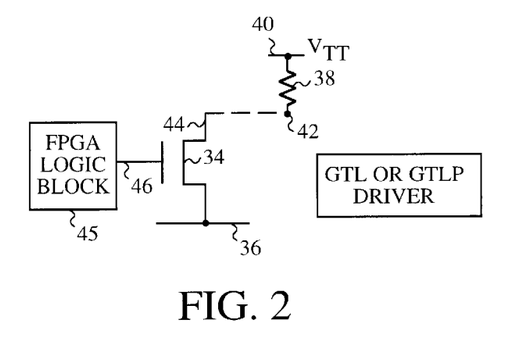
FIG. 2 is a circuit diagram of an FPGA driver that can drive GTL or GTLP circuits.

FIG. 2 is a diagram of an open collector driver for an FPGA which is compatible with the GTL and GTLP logic families. This driver is comprised of a single NMOS device 34 with its source coupled to the low rail 36 and an open drain. The size of the channel of transistor 34 is selected to meet the drive capability, i.e., current supply minimum and Vol max (logic 0 maximum voltage) with a specified load resistance, and provide some slew rate adjustment as specified in the GTL or GTLP family specification. The drain 44 is the output pin and the signal generated by the FPGA logic block 45 is coupled (usually selectively coupled via an active link or other programmable connection) to the gate 46 to turn transistor 34 on or off. The drain is coupled to the high rail 40 through an external load transistor 38 such that the output signal can be taken off node 42. The high rail supplies a voltage $V_{TT}$ to the device through the load resistor. As was the case for FIG. 1, the values of voltage on the high and low rail are established to set the logic 1 and logic 0 levels properly for either the GTL or GTLP standard. The value of load resistor 38 is established at 50 ohms if the driver is to be used to drive a GTL family circuit and 25 ohms if the driver is to be used to drive a GTLP family circuit.

Figure 3:
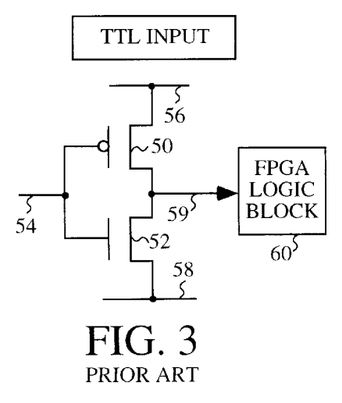
FIG. 3 is a circuit diagram of an FPGA input circuit that can accept input signals from TTL circuits.

Referring to FIG. 3, there is shown a prior art CMOS input circuit compatible with TTL levels which has been used on prior art FPGAs to receive signals from TTL circuits and couple them to an FPGA logic block. The circuit is comprised of a PMOS transistor 50 and an NMOS transistor 52 which have their gates coupled to the FPGA input pin 54. The two MOS transistors are coupled in series as a CMOS pair between a high rail 56 and a low rail 58 which supply voltages selected to convert the TTL logic swings on line 54 to CMOS logic swings used internally in the logic blocks of the FPGA. The output logic signals on line 59 are selectively coupled through active links or other FPGA programmable connections to an FPGA logic block 60. The size of the channels of transistors 50 and 52 are selected to establish any required current sink capability.

Figure 4:
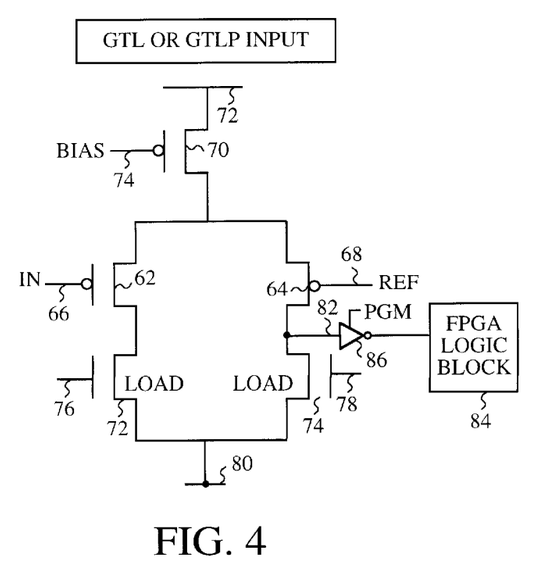
FIG. 4 is a circuit diagram of an FPGA input circuit which can receive signals from GTL or GTLP family circuits.

Referring to FIG. 4, there is shown a diagram of the type of input circuit useable to receive signals from GTL or GTLP families. The input circuit comprises a differentially coupled pair of PMOS devices 62 and 64 with device 62 having its gate 66 being the FPGA input pin and coupled to receive a single ended signal from the external GTL or GTLP circuit. The gate 68 of device 64 is coupled to receive a reference voltage for single ended input signals and to receive the complementary signal to the signal on line 66 in the case of differential input signals. The drains of transistors 62 and 64 are coupled through a PMOS bias transistor 70 to the high rail 72. The gate 74 of transistor 70 receives a bias control signal which controls the amount of current flowing through devices 62 and 64. A pair of NMOS devices 72 and 74 receive gate signals on lines 76 and 78 which control the conductivity of the channels of devices 72 and 74 such that they act as a load. The sources of devices 72 and 74 are coupled to the low rail 80. The logic 1 and logic 0 voltages are established at output 82 to drive FPGA logic block 84 through a programmable active link repeater 86 which also functions to selectively couple output 82 to FPGA block 84 as well as provide buffering and inversion. In other embodiments, the active link may be omitted and some other selective connection FPGA link such as a fusible link may be substituted. The voltage levels generated for logic 0 and logic 1 are dependent upon the voltages on the high and low rails 72 and 80 and the resistance values of the loads 72 and 74 as established by the control signals on lines 76 and 78 and the amount of current flowing in the devices 62 and 64 as established by their channel width and the value of the bias current generated by transistor 70. The logic level of the input signal on line 66 relative to the reference voltage on line 68 causes the transistors 62 and 64 to steer current either down the left branch through load 72 or through the right branch through load 74 to cause the voltage swings on output line 82. The foregoing description assumes a single ended signal. However, by substituting the complementary signal for the reference signal on line 68, the input circuit can be used to receive differential GTL or GTLP signals.

Figure 5:
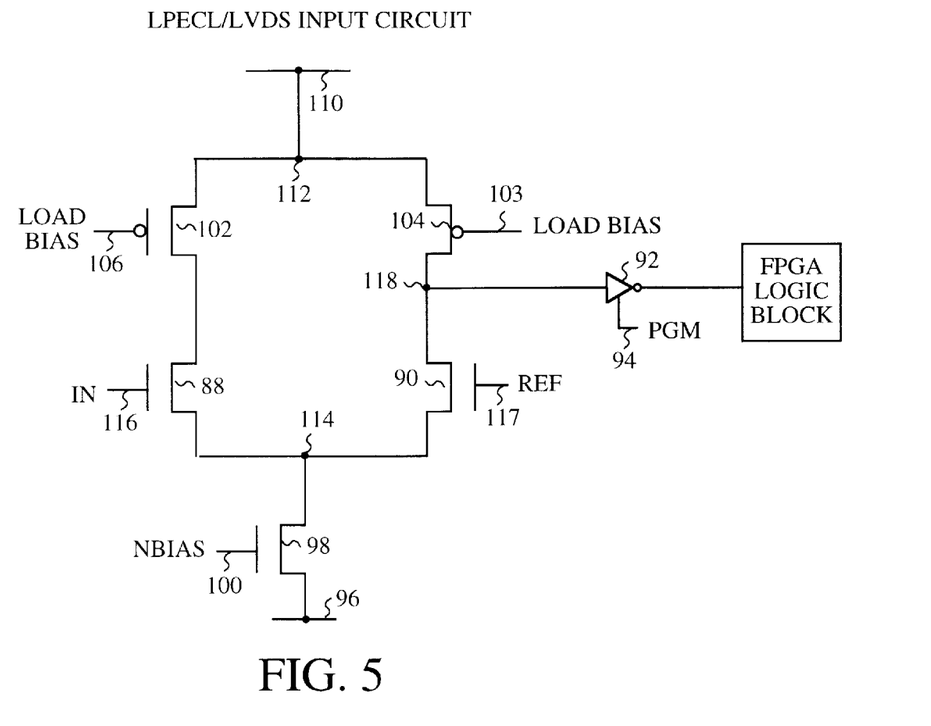
FIG. 5 is a circuit diagram of an FPGA input circuit which can receive signals from LVPECL and LVDS circuits.

Referring to FIG. 5, there is shown an FPGA input circuit for LVPECL and LVDS family circuits driving the input pin of the FPGA. The circuit is comprised of a differentially coupled pair of NMOS devices 88 and 90 with the gate of transistor 88 coupled to the input pin of the FPGA through a programmable FPGA connection structure such as an active link repeater which is controlled to either make the connection or block it depending upon the state of PGM signal on line 94. The sources of transistors 88 and 90 are coupled to a low rail voltage supply line 96 through an NMOS bias transistor 98. This transistor receives NBIAS signal on line 100 to control the amount of current flow through devices 88 and 90. PMOS load transistors 102 and 104 receive load bias control signals on line 106 and 108 to control their resistivities so as to establish load resistances. The drains of the load devices are coupled to the high rail 110. As was the case for the input circuit of FIG. 4 described above, the voltage levels generated for logic 0 and logic 1 are dependent upon the voltages on the high and low rails and the resistance values of the loads and the amount of current flowing in the devices 88 and 90 as established by their channel width and the value of the bias current generated by transistor 98. The logic level of the input signal on line 116 relative to the reference voltage on line 117 causes the transistors 88 and 90 to steer current either down the left branch through load 102 or through the right branch through load 104 to cause the voltage swings on output line 118. The foregoing description assumes a single ended signal. However, by substituting the complementary signal for the reference signal on line 117, the input circuit can be used to receive differential signals.

Figure 6:
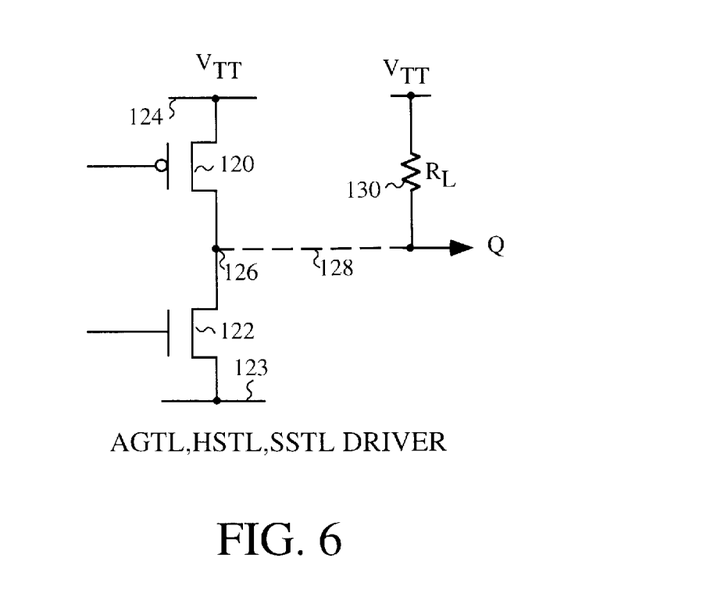
FIG. 6 is a circuit diagram of an FPGA driver circuit which can drive AGTL, HSTL or SSTL circuits.

Referring to FIG. 6, there is shown a circuit diagram for an FPGA driver capable of driving the AGTL, HSTL and SSTL families of circuits. The driver consists of a CMOS pair of transistors 120 and 122 coupled between a high rail voltage supply 124 and a low rail voltage supply 123. The actual output pin of the FPGA is symbolized by node 126. Dashed line symbolizes an off-chip connection to a load resistor 130 which couples the high rail supply voltage $V_{TT}$ to node 126.

The genus of the invention includes any programmable circuitry that can be configured with programming bits to assume any one of the configurations given in FIGS. 1 through 6 or any other FPGA driver or input circuits developed in the future to drive signals to external circuits off the FPGA or receive signals into the FPGA from off-chip circuits in new technology families to be developed in the future. Essentially, the invention is a programmable I/O circuit for an FPGA which, by changing some programming bits, can be transformed into any one of the FPGA driver or input circuits shown in FIGS. 1–6 or which will be developed in the future. The exact details of how the programmability is achieved are not critical, so long as the FPGA I/O circuit is programmable so as to be compatible with existing or future developed off chip technology families.

A subgenus within this main genus includes programmable slew rate. This is achieved by having multiple parallel transistors either with different channel widths which may be substituted or by having multiple parallel transistors all with the same channel width which may be added in parallel to add additional current sinking or current sourcing capability to alter the slew rate. Typical values for programmable slew rates are given in the publicly available data sheet for the DL6000 family of FPGAs offered by the assignee of the present invention, which is hereby incorporated by reference.

Figure 7:
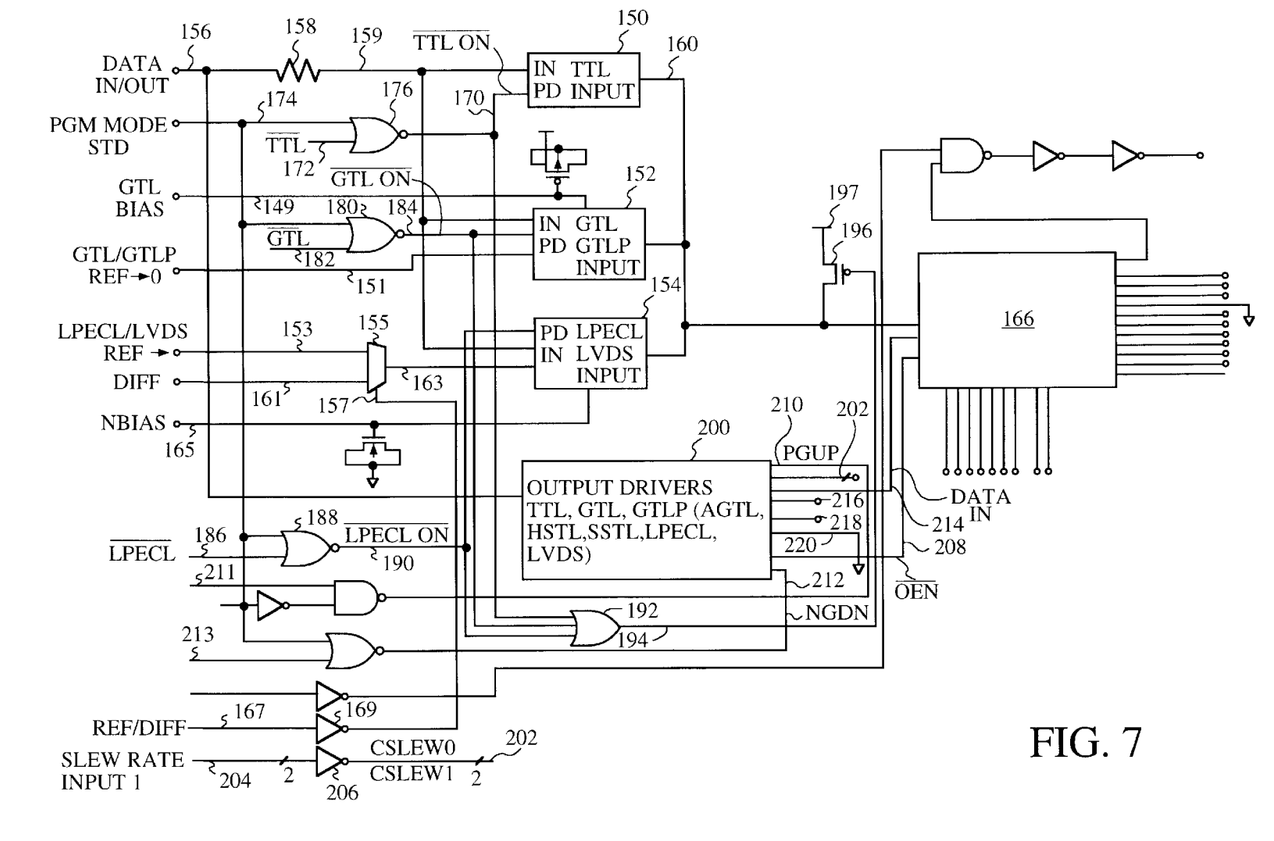
FIG. 7 is a block diagram of the preferred programmable input/output circuit according to the teachings of the invention.

Referring to FIG. 7, there is shown a top level block diagram of an example and the preferred embodiment of an FPGA programmable input/output (hereafter I/O) circuit. This circuit includes a TTL input circuit 150 which implements the function of the circuit of FIG. 3, a GTL and GTLP input circuit 152 which implements the function of the circuit of FIG. 4 and a LVPECL and LVDS input circuit 154 which implements the function of the circuit of FIG. 5. The TTL input circuit 150 has an output 160 which is also coupled to the outputs of the GTL and GTLP input circuit 152 and the LVPECL and LVDS input circuit 154. Each of these outputs can be put in tristate isolation by programming bits so only one input circuit at a time is driving output line 160. Output line 160 is coupled to a boundary scan circuit 166 that does not form part of the invention. The boundary scan circuit couples input and output signals from pin 156 through the various input circuits and drivers to the matrix of logic blocks in the FPGA array.

The input signal to the FPGA from some off chip circuit in one of these families arrives on pin 156 and is coupled through resistor 158 to each of these input circuits 150, 152 and 154 via line 159. The circuit is programmable such that only one of the input circuits 150, 152 and 154 is turned on at any particular time and the others are disabled such that they do not act on the input signal and their outputs are placed in tristate isolation. In alternative embodiments, the circuit of FIG. 7 also includes a driver circuit that implements the function of the AGTL, HSTL and SSTL input circuit of FIG. 6.

If the circuit driving the pin 156 is a TTL circuit, then a TTL* programming bit on line 172 is set to logic 0 and a PGM MODE STD signal on line 174 is set to logic 0 so as to not block the action through the NOR gate of the programming bit on line 172. This causes NOR gate 176 to drive TTL ON* (* indicates signal is active low) line 170 to logic 1. This turns on input circuit 150 and it then acts on the input signal on line 156 as the circuit of FIG. 3 acts on the signal on line 54 to convert it to the logic levels in use inside the FPGA on line 59. At the same time, all the other input circuits 152 and 154 are turned off by virtue of their programming bits set to logic 1 and their outputs are tristate so as to not affect the voltage level on line 160. Specifically, the other input circuits 152 and 154 are disabled by setting their programming bits, specifically, GTL* on line 182 and LVPECL* on line 186, to logic 1 so that their power down signals on lines 184 and 190 are set to logic 0 to power down the other input circuits. That is, when the GTL* programming bit on line 182 is high, NOR gate 180 drives the GTL ON* signal on line 184 to logic 0 which disables GTL and GTLP input circuit 152. When the LVPECL programming bit is high, NOR gate 188 drives LVPECL ON* signal on line 190 to logic 0 which disables LVPECL and LVDS input circuit 154.

The other input circuits can be turned on in a similar fashion by manipulation of the programming bits so that only one is enabled at any particular time. When the GTL and GTLP input circuit is enabled, a reference voltage corresponding to the reference voltage on line 68 in FIG. 4 is applied to line 151. A GTL BIAS signal supplied via line 149 corresponds to the bias signal on line 74 in FIG. 4 and controls the level of current flow through a pair of differentially coupled CMOS pairs inside block 152.

The term "programming bits" refers to enable or steering signals the logic state is set by the logic 0 or logic 1 state of a programming bit in a memory. The function and configuration of an FPGA is defined by programming bits which are stored in internal memories in the FPGA when the chip is set up.

When any one of the enable or power down signals on lines 170, 184 or 190 is in a logic 1 state indicating an input circuit is enabled, OR gate 192 drives line 194 to logic 1 which turns off PMOS pullup transistor 196 off so that output line 160 is left to be driven to either logic 0 or logic 1 depending upon the state of the input signal on line 156. When all of the input circuits 150, 152 and 154 are disabled, all three input signals to OR gate 192 are logic 0 so line 194 is logic 0. This causes pullup transistor 196 to be turned on and connects output line 160 to the high rail 197 to prevent output line 160 from floating so that it can never be in an unknown state.

The LVPECL and LVDS input circuit 154 is also programmable as to whether it receives a single ended input signal or a differential input signal by virtue of the operation of multiplexer 155. A single ended signal arrives on line 156 when the LVPECL and LVDS input circuit 154 is activated, and multiplexer 155 is controlled by the programming bit on line 157 to select the reference voltage REF on line 153 for coupling to the input line 163. Input line 163 corresponds to input 117 in FIG. 5. If differential input signals are being received from the external circuit, the programming bit on line 157 is set to select the differential signal suppled to pin 161 by the external circuit for coupling to line 163. The programming bit on line 157 is the REF/DIF signal on line 167 which drives line 157 through inverter 169. The bias level to the LVPECL and LVDS input circuit 154 is controlled by the signal on line 165. A straightforward modification of the circuit of FIG. 7 to add a multiplexer like multiplexer 155 to control the data inputs to the GTL and GTLP input circuit 152 will allow the GTL or GTLP input circuit to receive either differential or single ended GTL or GTLP signals.

The PGM MODE STD signal on line 174 is an optional enhancement which allows all I/O pins to be controlled to have one known state during programming mode to configure the chip by setting the various programming bits to their desired logic states. This signal comes from the configuration logic and is set to a particular logic state during programming mode so that all I/O pins have a known state during programming. The PGM MODE STD is a global override signal which is activated during the programming mode to a logic 1 for all I/O pins that are to be disabled. When the PGM MODE STD signal is set to a logic 1 during programming, it causes the output of the NOR gates to ignore their programming bits and hold the power down signals on lines 170, 184 and 190 at logic 0. This disables all the input circuits 150, 152 and 154 so they cannot act on signals at the input pins and ignore their programming bits.

The configuration logic sets the state of the PGM MODE STD signals to groups of I/O pins individually during programming mode to disable some groups of pins and enable others. In other words, each I/O pin gets a PGM MODE STD signal from the configuration logic, but these signals do not all have to be in the same state. During programming, the TTL, GTL and LVPECL programming bits are not programmed yet, but all come up in a known logic 0 state. This allows some pins to be enabled in a known state during programming and others to be disabled.

Output driver circuit 200 contains the predriver and final driver for each circuit family that the FPGA can provide output signals to. In the currently implemented embodiment, the circuit 200 contains only output drivers for TTL, GTL and GTLP logic families. However, in other species, output circuit will include output drivers for the recently introduced AGTL, HSTL, SSTL families and for the LVPECL and LVDS families. Driver circuits to convert from CMOS levels to the voltage levels, reference voltages and slew rates for the AGTL, HSTL, SSTL families and for the LVPECL and LVDS families are known in the prior although not in the FPGA art. These circuits may be integrated into CMOS on the FPGA and included as part of circuit 20 with suitable enabling circuitry such that the proper one of these driver circuits may be enabled to drive pin 156 as an output with all the other drivers turned off. The output circuit 200 also has a programmable slew rate between fast, medium and slow settings. The input circuits have high impedance CMOS inputs so they do not have programmable sink rates for current as they do not load down the circuits that drive pin 156.

The particular type of output driver between TTL and GTL or GTLP and the particular slew rate or current drive capability in effect are controlled by three bits on bus 202 from the configuration logic (not shown). The output line of the driver circuit is the line coming out the left side of block 200 and connected to pin 156. The two programming bits from the configuration logic which control the slew rate are input as the two bits on the slew rate input signals bus 204 through inverter 206 to set the values of the two slew rate bits on bus 202. The third configuration bit on bus 202 controls whether the internal GTL and GTLP driver or the TTL driver is enabled. This third configuration bit is the ouput signal GTL ON* output by NOR gate 180 in response to the GTL* programming bit on line 182. If the GTL* programming bit has the GTL and GTLP input circuit enabled, the GTL and GTLP output circuit will also be enabled to drive output signals out pin 156. If GTL* is not asserted (logic 1), the TTL output driver in box 200 is enabled and pin 156 will be a TTL output. It is possible to disable the TTL or GTL and GTLP output circuit without disabling the selected TTL or GTL and GTLP input circuit by asserting an output enable signal OEN* on line 208. When this signal is asserted low, the output line 156 will be enabled and the driver will be enabled and drive output line 156 in accordance with the input data on line 214. When OEN* is logic 1, output line 156 is placed in tristate mode and the internal TTL and GTL or GTLP drivers will be disabled. OEN* is asserted by programming bits in the FPGA logic block array or output multiplexers which are not shown.

The output line 156 has 4 different states in the preferred embodiment because some users like to control the state of their bus line connected to pin 156 when the output line from output driver 200 is tristate. The states of output line 156 are on and driven, tristate float, tristate pulled up and tristate pulled down. The last two states are optional and implemented by programmable PGUP and NGDN signals on lines 210 and 212, respectively. These signals are controlled by programming bits on lines 211 and 213, respectively.

The DATA IN signal on line 214 is the data signal generated by the logic blocks of the FPGA array which is fed to the input of the TTL or GTL driver and corresponds to line 30 in FIG. 1 or line 46 in FIG. 2.

Lines 216 and 218 are the high and low rails, respectively to supply power to the driver circuit. Line 220 is a substrate tap and is the equivalent of a quiet, low noise low rail voltage supply.

Any circuitry known in the prior art which is capable of performing the functions of the drivers and input circuits of FIGS. 1 through 6 and which is capable of being modified so that it may be enabled and disabled by programming bits and which may be integrated onto an FPGA may be used to implement the functions of blocks 150, 152, 154 and 200 in FIG. 7. Examples of specific circuits are given below.

Figure 8:
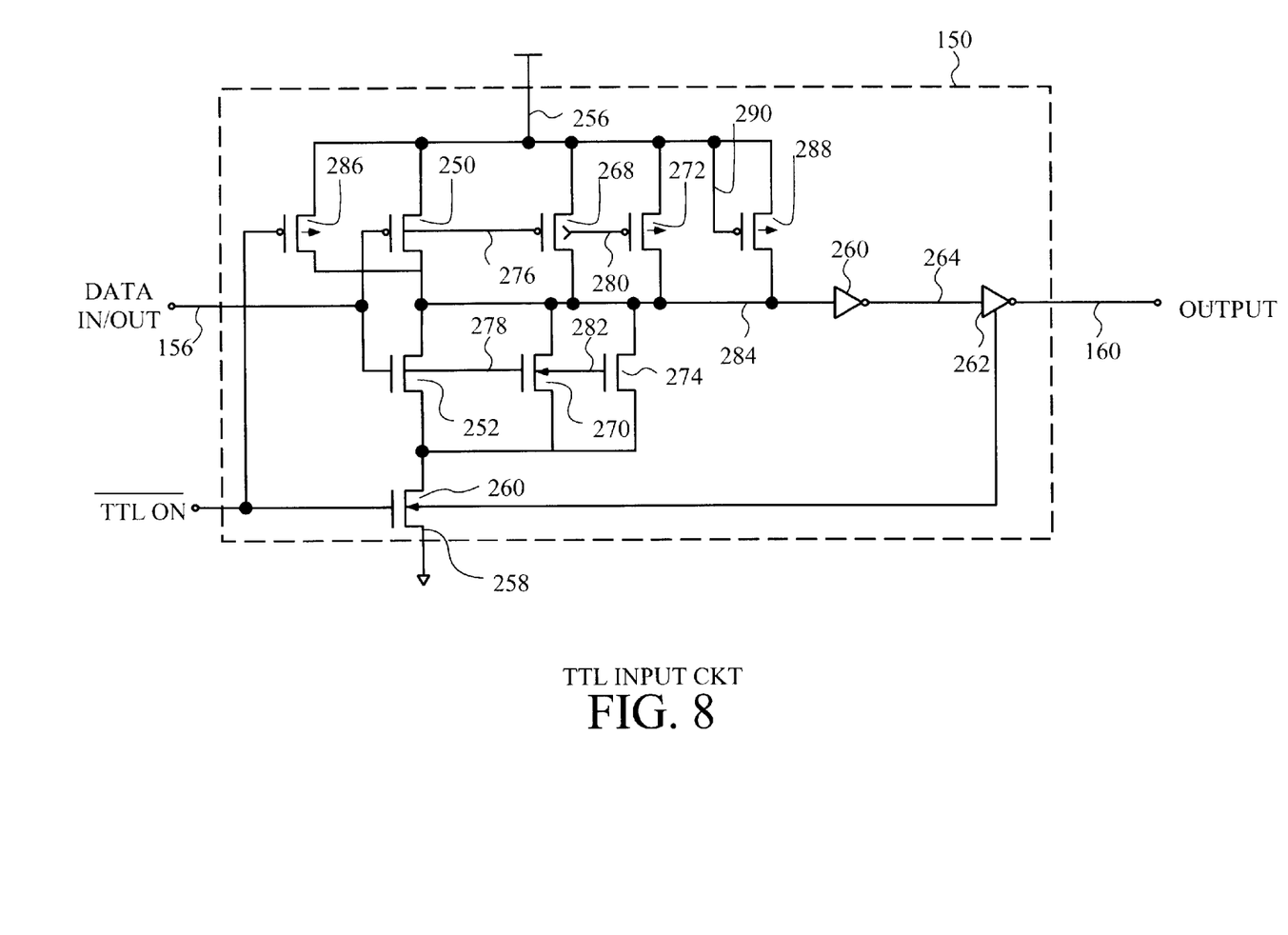
FIG. 8 is an example of the preferred form of TTL input circuit that implements the functions of block 150 in FIG. 7.

Referring to FIG. 8, there is shown an example of the preferred form of TTL input circuit that implements the functions of block 150 in FIG. 7. Transistor 250 is the PMOS transistor corresponding to transistor 50 in FIG. 3, and transistor 252 is the NMOS device corresponding to transistor 52 in FIG. 3. The data input signal is applied to line 156 corresponding to line 54 in FIG. 3 and line 156 in FIG. 7. The high rail connection corresponding to 56 is FIG. 3 is at 256, and the low rail connection is at 258. Transistor 260 is the enable transistor. When transistor 260 is on, the CMOS pair comprised of transistors 250 and 252 are connected to the low rail 258 and operate to convert the TTL levels at input 156 to CMOS output levels on output 160. A tristate buffer 262 functions to allow output signals on segment 264 output by final driver inverter 266 to drive output line 160 when the TTL input circuit is enabled and to tristate line 160 when the TTL input circuit is disabled. PMOS device 286 is a second enabling transistor which turns on when TTL ON* is low thereby raising the source of PMOS device 250 to the level of the high rail thereby disabling it since the drain of device 250 is always coupled to the high rail. PMOS transistor 288 is coupled as a resistor.

Two pairs of CMOS devices comprised of PMOS transistor 268 and NMOS transistor 270 and PMOS transistor 272 and NMOS transistor 274 are provided optionally (by use of a metal mask option) to enable adjustment of the trigger point using metal options. In case the devices sizes selected for the CMOS pair 250 and 252 do not work out in the final silicon to provide the proper threshold voltages for proper TTL to CMOS conversion, the differently sized pairs can be turned on by changing the metal mask to change the thresholds. This is a pure practicality based upon the fact that simulation results do not always agree exactly with actual results given the vagaries of the process of manufacturing the device. The input signal on line 156 is currently coupled via metal option line segments 276, 280, 278 and 282 to the gates of the CMOS pairs so that PMOS devices 250, 268 and 272 are all activated and all act on the input signal on line 156. A fourth PMOS device 288 is turned off by metal option line segment 290 so it does not act on the input signal. Likewise, three NMOS devices 252, 270 and 274 are all connected via metal option line segments so as to act on the input signal on line 156. Each CMOS pair is coupled to output line segment 284. In a subsequent design cycle spin, the three PMOS and three NMOS transistors may be omitted and a single PMOS and single NMOS transistor of the proper sizes to achieve the desired threshold may be substituted for equivalent operation.

Figure 9:
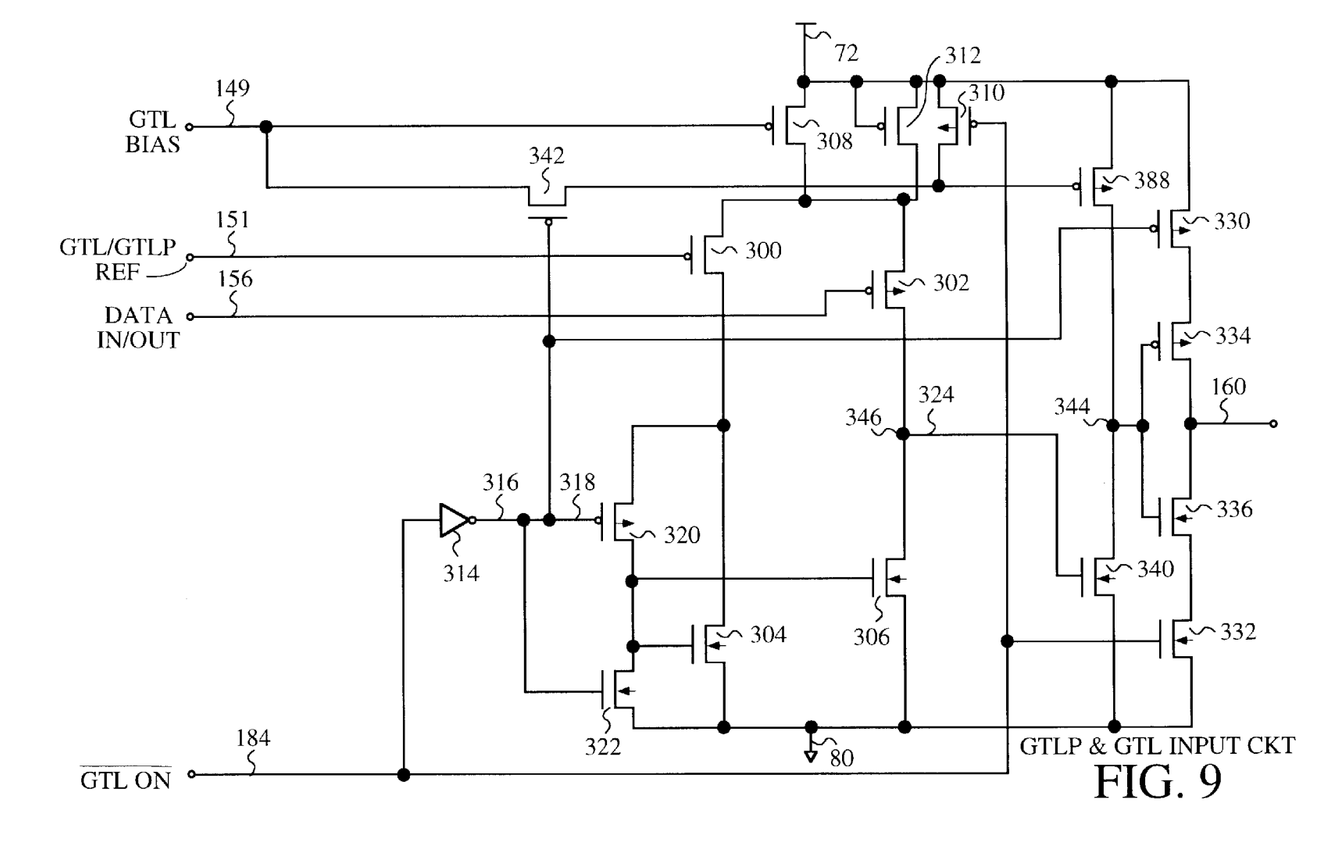
FIG. 9 is an example of the preferred form of GTLP and GTL input circuit to implement the function of block 152 in FIG. 7 and act like the circuit of FIG. 4.

Referring to FIG. 9, there is shown an example of the preferred form of GTLP and GTL input circuit to implement the function of block 152 in FIG. 7 and act like the circuit of FIG. 4. If the input data from the off chip GTL circuit is single ended, it is applied to pin 156, and a reference voltage compatible with the GTL/GTLP standard is applied to line 151. If the input data from the off chip GTL or GTLP circuit is differential, the true version is applied to line 156 and the complement version is applied to line 151 which correspond to like numbered lines in FIG. 7. PMOS transistors 300 and 302 correspond to transistors 62 and 64 in FIG. 4 and perform the same function in the combination. NMOS transistors 304 and 306 function as the load devices for transistors 300 and 302 and correspond to transistors 72 and 74, respectively, in FIG. 4.

Transistor 308 is an adjustable current source which corresponds to transistor 70 in FIG. 4 and connects the high rail 72 to the PMOS devices 300 and 302 to drive an adjustable amount of current therethrough. The GTL BIAS signal on line 149 controls the current level that flows through the CMOS pairs and gets steered by the input data through one branch or the other. Transistor 312 is a metal option transistor that can be added to adjust the bias but which is shown as currently inoperative by virtue of its gate being connected to its drain.

When the GTL ON* signal is asserted to logic 0 to power down the input circuit, inverter 316 drives line 318 to logic 1. This turns off PMOS transistor 320 and turns on NMOS transistor 322 thereby shorting the gates of load transistors 304 and 306 to ground or low rail 80 thereby disabling these load transistors such that they look like very high impedances to the active devices 300 and 302 which receive the input data. The active devices are thus disabled and do not translate the input data at GTL levels to the CMOS logic levels on output line 324. When GTL ON* is logic 1, the GTL and GTLP input circuit is rendered operational by turning on transistor 320 and turning off transistor 322. This shorts the gates of load transistors 304 and 306 to their drains and the sources of the active devices 300 and 302. This causes load devices 304 and 306 to be variable resistors depending upon the state of the input data thereby enabling the logic level conversion process.

When GTL ON* is active low and the circuit is to be disabled, PMOS transistor 330 is off because its gate is connected to line 318 which is at logic 1, and NMOS transistor 332 is off because its gate is connected directly to GTL ON*. This isolates the drain of PMOS transistor 334 from the high rail 72. Transistor 334 is part of a CMOS output driver which drives output line 160 and includes NMOS device 336. Likewise, transistor 332 isolates the source of transistor 336 from the low rail 80 so output 160 is placed in tristate mode.

When GTL ON* is active low and the circuit is to be disabled, PMOS transistor 310 is on which couples the high rail (a positive voltage supply exceeding the threshold of the PMOS devices) to the gate of PMOS transistor 338 thereby turning it off. Transistor 342 is off when GTL ON* is logic 0. This isolates the drain of the output driver transistor 340 from the high rail thereby disabling it from driving any output signals onto line 344 connected to the gates of the CMOS totem pole output drivers driving line 160. When GTL ON* is a logic 1, transistor 310 is off and transistor 342 is on thereby coupling the GTL BIAS control signal on line 149 to the gate of PMOS transistor 338. This causes transistor 338 to act as a load resistor for NMOS driver transistor 340 thereby enabling it to convert the analog voltages on line 346 caused by the current steering effect of transistors 300 and 302 under the influence of the input data into output voltages on line 344 compatible with CMOS logic levels. CMOS drivers 334 and 336 then output these voltages on line 160 where there are selectively coupled through programmable FPGA connection devices to one or more FPGA logic blocks.

Figure 10:
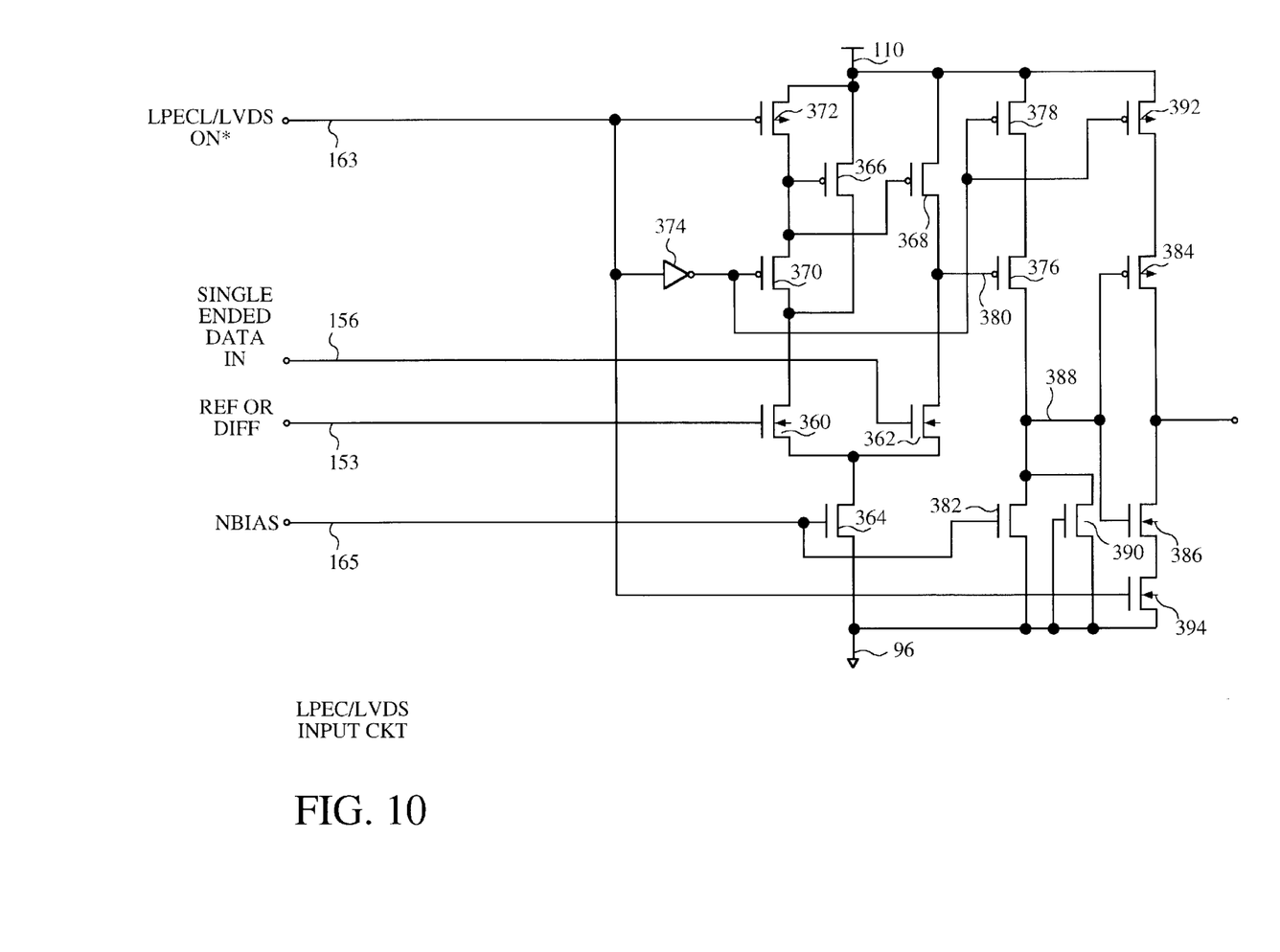
FIG. 10 is a circuit diagram for an LVPECL/LVDS input circuit that can be used to implement the function of block 154 in FIG. 7.

Referring to FIG. 10, there is shown a circuit diagram for an LVPECL/LVDS input circuit that can be used to implement the function of block 154 in FIG. 7. The data input from the off-chip LVPECL/LVDS circuit arrives on line 156 only for single ended data. For single ended data, a reference voltage compatible with the LVPECL/LVDS standard is applied to line 159. If the input data is differential in nature, then the complementary signal to the signal on line 156 is applied to line 159.

NMOS transistors 360 and 362 coupled as a differential pair act as current steering devices to steer the current from a current source implemented by NMOS transistor. Transistors 360 and 362 correspond in function to transistors 88 and 90 in FIG. 5. The NBIAS signal on line 165 is coupled to the gate of transistor 364 and controls it to establish the desired level of current flow to give the desired logic level conversion from LVPECL/LVDS levels to the CMOS levels used inside the FPGA given the load resistances provided by the PMOS load devices 366 and 368. Transistors 370 and 372 provide power down enabling and disabling functionality and have their gates coupled to the programming signal LVPECL/LVDS ON* generated by a programming bit during normal operation. When the LVPECL/LVDS ON* signal is active low, PMOS transistor 372 is on. This shorts the gates of transistors 366 and 368 to their drains and the high rail 110 thereby disabling both load devices and making them essentially infinite impedances. This reduces the current through both NMOS transistors 360 and 362 to zero thereby rendering them inoperative.

When the LVPECL/LVDS ON* signal is inactive or logic 1, inverter 374 drives the gate of PMOS transistor 370 to logic 0 thereby turning it on. When transistor 370 is turned on, the gate and source of transistor are shorted together and the gate of load device 368 is coupled to the gate of transistor 366 thereby activating both load devices and transistors 360 and 362.

The output signal on line 380 from the current steering activity of transistors 360 and 362 is coupled to the gate of PMOS output driver transistor 376. When the output voltage on line 376 is high, PMOS device 376 is off which causes NMOS current source transistor to pull the output voltage on line 388 low. When the voltage on line 380 is high, PMOS transistor 376 is one and will pull line 388 high because power down PMOS transistor 378 is on and device 376 overpowers the current source 382. PMOS device 376 has its source coupled to NMOS transistor 382 which acts as a current source since its gate is coupled to the NBIAS signal on line 165. A deactivated metal mask option transistor 390 provides the ability to adjust the level of current supplied by current source 382. This allows the proper voltage conversion to be made. PMOS transistor 378 acts to disable the output driver 376 by cutting it off from the high rail 110 when the LVPECL/LVDS ON* signal is active low. When LVPECL/LVDS ON* is inactive high, PMOS transistor 378 is one and the output driver 376 is operative.

The output signal from driver transistor 376 on line 388 is coupled to the gates of totem pole CMOS transistors 384 and 386. These two transistors are disabled by being cut off from the high rail 110 and low rail 96 by PMOS transistor 392 and NMOS transistor 394. When the LVPECL/LVDS ON* signal is low, PMOS transistor 392 is off and transistor 394 is off cutting the totem pole drivers off from the high and low rails. This creates a tristate buffer. When the LVPECL/LVDS ON* signal in inactive, the transistors 392 and 394 are turned on and the totem pole drivers are connected to the high and low rails and are active.

Figure 11:
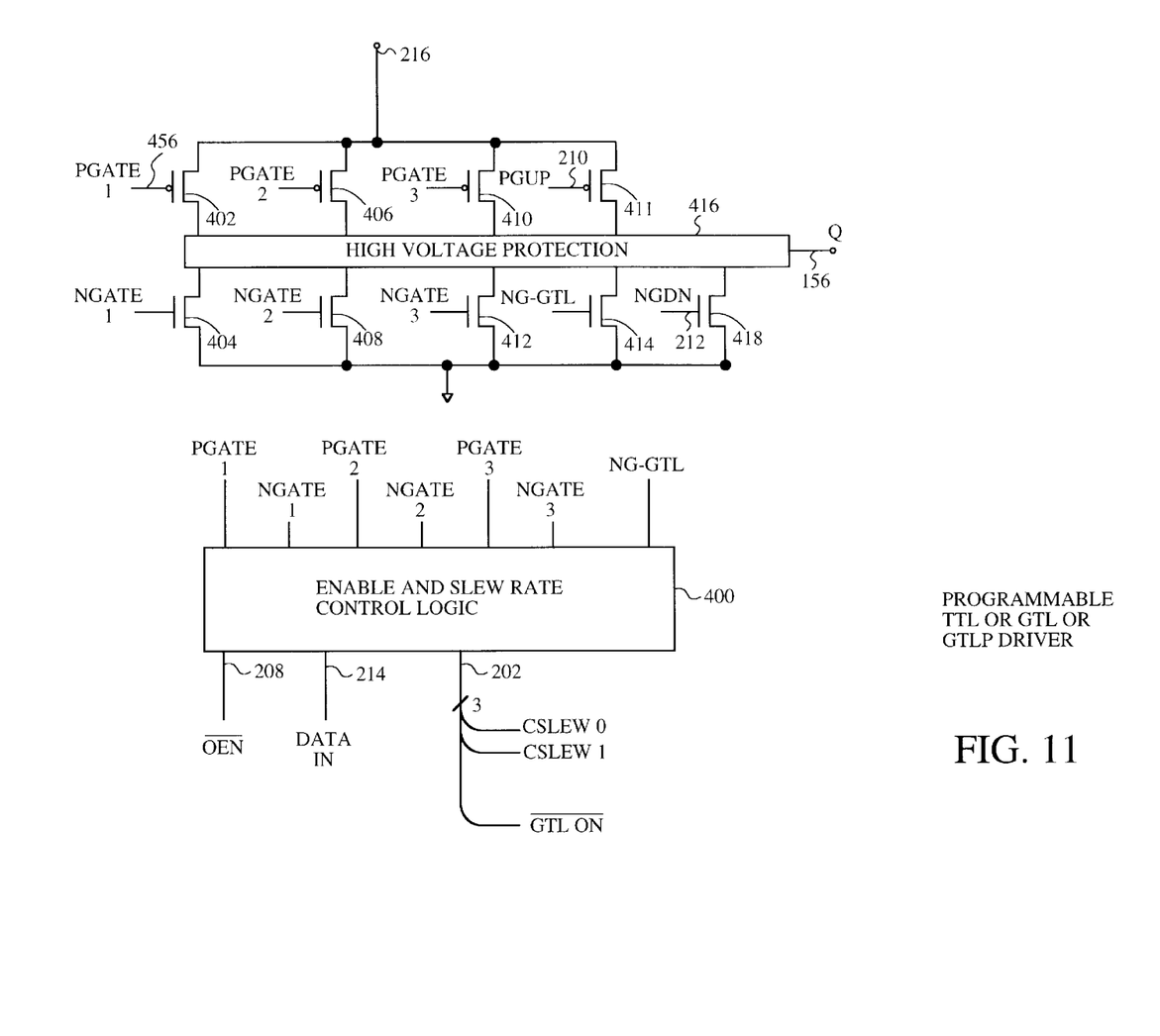
FIG. 11 is a diagram of a TTL/GTL driver circuit which may be used to implement the function of block 200 in FIG. 7 with programmable slew rate.
Figure 12:
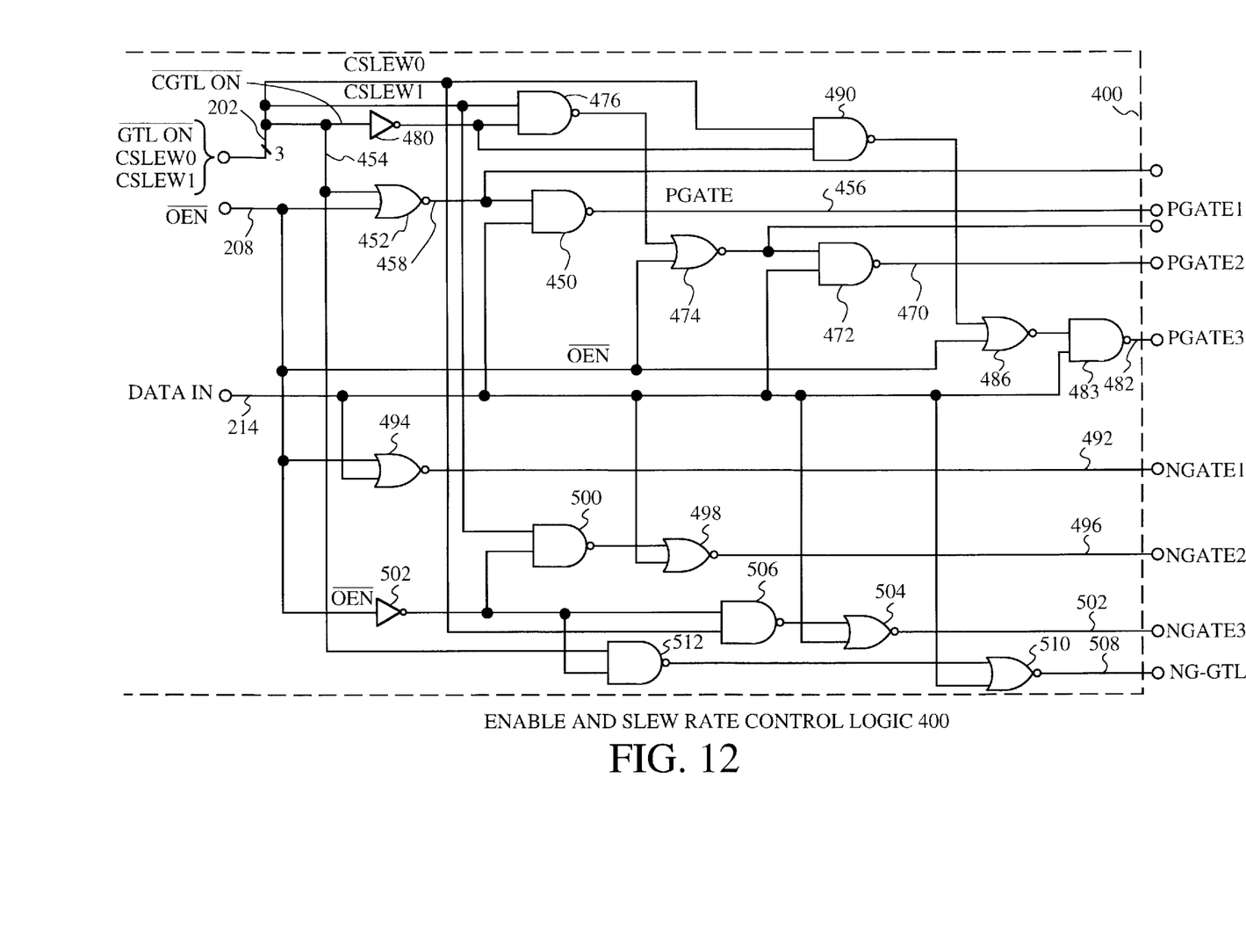
FIG. 12 is one implementation of logic block 400.

Referring to FIG. 11, there is shown a diagram of a TTL/GTL driver circuit which may be used to implement the function of block 200 in FIG. 7 with programmable slew rate. The circuit of FIG. 11 basically acts like the circuit of FIG. 1 when programmed to be a TTL driver except that the circuit of FIG. 12 is used to generate signals on the gate control lines that correspond to lines 30 and 32 in FIG. 1. The slew rate is controlled by logic block 400 in response to the state of its input signals CSLEWO and CSLEW 1 on bus 202. Likewise, whether the driver functions as a TTL driver like that shown in FIG. 1 or a GTL driver like that shown in FIG. 2 is also controlled by logic block 400 in accordance with input signal GTL ON* on bus 202. The logic block 400 also controls the tristate output of output line 156 in accordance with the state of the OEN* input on line 208.

Suppose CSLEWO and CSLEW 1 are set to establish a slow slew rate and GTL ON* is set to establish the driver as a TTL driver. In this case, only transistors 402 and 404 will be activated and transistors 406, 408, 410, 412 and 414 will all be turned off by logic 400 by controlling their gate signals PGATE 2, NGATE 2, PGATE 3, NGATE 3 and NG-GTL to logic states to turn off the transistors. In this situation, the DATA IN signal on line 214 causes logic block 400 to drive the PGATE 1 and NGATE 1 signals with the same logic level according to the desired data output. If a logic 0 is to be ouput, both the NGATE 1 and PGATE 1 signals are driven to logic 1 which turns NMOS transistor 404 on and turns PMOS transistor 402 off. This pulls the Q output line 156 low at a slow slew rate. If a logic 1 is to be output, the reverse situation is caused by driving both PGATE 1 and NGATE 1 with a logic 0. This turns on transistor 402 and turns off transistor 404 thereby pulling 156 high at a slow slew rate.

Suppose CSLEWO and CSLEW 1 are set to establish a medium slew rate and GTL ON* is set to establish the driver as a TTL driver. In this case, only transistors 402, 404, 406 and 408 will be activated and transistors 410, 412 and 414 will all be turned off by logic 400 by controlling their gate signals PGATE 3, NGATE 3 and NG-GTL to logic states to turn off the transistors the gates of which these signals are driving. In this situation, the DATA IN signal on line 214 causes logic block 400 to drive the PGATE 1, NGATE 1, PGATE 2 and NGATE 2 signals with the same logic level according to the desired data output. If a logic 0 is to be ouput, all of the PGATE 1, NGATE 1, PGATE 2 and NGATE 2 signals are driven to logic 1 which turns NMOS transistors 404 and 408 on and turns PMOS transistors 402 and 406 off. This pulls line 156 low at a medium slew rate. If a logic 1 is to be output, the reverse situation is caused by driving the PGATE 1, NGATE 1, PGATE 2 and NGATE 2 signals with a logic 0. This turns on transistors 402 and 406 and turns off transistors 404 and 408 thereby pulling 156 high at a medium slew rate.

Now suppose CSLEWO and CSLEW 1 are set to establish a fast slew rate and GTL ON* is set to establish the driver as a TTL driver. In this case, transistors 402, 404, 406, 408, 410 and 412 will all be activated and transistor 414 will be turned off by logic 400 by controlling its gate signal NG-GTL to a logic state to turn off 414. In this situation, the DATA IN signal on line 214 causes logic block 400 to drive the PGATE 1, NGATE 1, PGATE 2, NGATE 2, PGATE 3 and NGATE 3 signals with the same logic level according to the desired data output. If a logic 0 is to be ouput, all of the PGATE 1, NGATE 1, PGATE 2, NGATE 2, PGATE 3 and NGATE 3 signals are driven to logic 1 which turns NMOS transistors 404, 408 and 412 on and turns PMOS transistors 402, 406 and 410 off. This pulls line 156 low at a fast slew rate. If a logic 1 is to be output, the reverse situation is caused by driving the PGATE 1, NGATE 1, PGATE 2, NGATE 2, PGATE 3 and NGATE 3 signals with a logic 0. This turns on transistors 402, 406 and 410 and turns off transistors 404 and 408 and 412 thereby pulling 156 high at a fast slew rate.

If the driver is to be operated as a GTL or GTLP driver, it must emulate the design and function of the circuit in FIG. 2 which is a single "open drain" NMOS device with an external load device. In this situation, logic block 400 controls the PGATE 1, PGATE 2 and PGATE 3 signals so that the PMOS transistors 402, 406 and 410 are always off regardless of the state of the input data on bus 214. NMOS transistors 404, 408, 412 and 414 are then controlled according to the input data and the desired slew rate. For a slow slew rate, only transistor 404 is active and transistors 408, 412 and 414 are all inactive and turned off. For a medium slew rate, transistors 404 and 408 are activated and transistors 412 and 414 are turned off regardless of the state of the input data. A fast slew rate is implemented by activating all of transistors 404, 408, 412 and 414 and driving them according to the input data.

If output 156 is to be disabled and put in tristate mode, which happens when the OEN* signal is active high, logic block 400 controls the PGATE and NGATE signals and the NG-GTL signal to turn all the PMOS and NMOS transistors off regardless of the state of the input data.

The CMOS transistors in the FPGA in which the invention resides use a 3.3 volt Vcc supply at node 216. It frequently happens that the FPGA is incorporated into circuitry that uses a 5 volt Vcc supply and that the 5 volt Vcc voltage can sometimes be applied to the shared output bus 156. To protect the driver transistors inside the FPGA from punchthrough and desctruction caused by 5 volt Vcc levels on output bus 156. In the preferred embodiment, this protection is provided by an optional breakdown protection circuit 416. The sources of transistors 402, 406, 410 and 411 are all coupled to the protection circuit 416 and their drains are all coupled to internal high rail Vcc supply 216. Likewise, the drains of all the PMOS transistors 404, 408, 412, 414 and 418 are all coupled to protection circuit 416. The protection circuit functions to preven any of these driver transistors from ever being exposed to a voltage difference between any two terminals which exceed 3.3 volts. In the preferred embodiment, the Vcc protection circuit 416 is comprised of extra MOS transistors in series with the source lines to each of the PMOS transistors 402, 406, 410 and 411 and in series with the drain lines of NMOS transistors 404, 408, 412, 414 and 418. The protection circuit functions to essentially act like it is not there when the driver circuit is on so that the PMOS and NMOS transistors see the proper voltage differentials between the low rail and high rail. When the driver circuit of FIG. 11 is off, all the PMOS and NMOS transistors are turned off, and the protection circuit 416 operates to protect the PMOS and NMOS transistors in case a high Vcc voltage of 5 volts gets applied to the Q output bus 156. The details of protection circuits like 416 are well known in the art. Such protection circuits are used on the DEC/Compaq Alpha microprocessor, and the details of these prior art protection circuits are hereby incorporated by reference. The protection circuit 416 can be omitted in embodiments where the voltage applied by external circuits to shared bus 156 is guaranteed to never be higher than the design voltage of 3.3 volts or whatever other Vcc voltage the internmal CMOS transistors of the FPGA are designed for.

Referring to FIG. 12, there is shown one implementation of logic block 400. The state of the PGATE 1 signal on line 456 is controlled by NAND gate 450. The input to gate 450 are the NOR of OEN* on line 208 and the CGTL ON* signal on line 454. When both OEN* and CGTL ON* are low, NOR gate 452 outputs a logic 1 on line. This causes the PGATE 1 ouput of gate 450 to be controlled by the data on line 214. When OEN* is high indicating the output line 156 is to be tristate or when CGTL ON* is high indicating the device is to be operated as a CGTL and CGTLP driver, line 458 is a 0 which causes NAND gate 450 to output a logic 1 for PGATE 1 which turns off PMOS transistor 402 regardless of the state of the data.

The PGATE 2 output signal on line 470 has its logic state controlled by NAND gate 472, NOR gate 474 and NAND gate 476 and the input signals CSLEW 1 and CGTL ON* and OEN*. NOR gate 474 outputs a logic 1 when OEN* is low (indicating a desire to enable the output line 156) and the output of NAND gate 476 is low. This happens when CSLEW1 is high indicating a desire for a medium slew rate and CGTL ON* is low indicating a desire for the driver to work as a TTL driver. When gate 474 outputs a logic 1, NAND gate 472 drives PGATE 2 in accordance with the data and the driver will be enabled and operating as a TTL driver. When OEN* is high, indicating a desire to tristate output line 156 in FIG. 7, NOR gate 474 outputs a logic 0 which forces NAND gate 472 to output a logic 1 regardless of the state of the data input thereby turning off PMOS transistor 406 to help tristate the output line. If CGTL ON* is high, this indicates a desire to activate the CGTL and CGTLP open drain driver architecture like the one shown in FIG. 2, and this requires that the upper PMOS transistors in FIG. 11 must be turned off. If CGTL ON* is high, inverter 480 outputs a logic 0 which causes NAND gate 476 to output a logic 1 and this causes gate 472 to output a logic 1 regardless of the state of the data thereby turning off PMOS transistor 406. The same thing will happen if CGTL ON* is low but CSLEW 1 is low indicating a desire to not have PMOS transistor 406 activated for the medium slew rate.

The PGATE 3 output signal on line 482 is controlled by NAND gate 483, NOR gate 486 and NAND gate 490 and the input signals CSLEW 0, CGTL ON* and OEN*. NOR gate 486 outputs a logic 1 when OEN* is low (indicating a desire to enable the output line 156) and the output of NAND gate 490 is low. This happens when CSLEWO is high indicating a desire for a fast slew rate and CGTL ON* is low indicating a desire for the driver to work as a TTL driver. When gate 486 outputs a logic 1, NAND gate 483 drives PGATE 3 in accordance with the data and the driver will be enabled and operating as a TTL driver. When OEN* is high, indicating a desire to tristate output line 156 in FIG. 7, NOR gate 486 outputs a logic 0 which forces NAND gate 483 to output a logic 1 regardless of the state of the data input thereby turning off PMOS transistor 410 to help tristate the output line. If CGTL ON* is high, this indicates a desire to activate the CGTL and CGTLP open drain driver architecture like the one shown in FIG. 2, and this requires that the upper PMOS transistors in FIG. 11 must be turned off. If CGTL ON* is high, inverter 480 outputs a logic 0 which causes NAND gate 490 to output a logic 1 and this causes NAND gate 483 to output a logic 1 regardless of the state of the data thereby turning off PMOS transistor 410. The same thing will happen if CGTL ON* is low but CSLEW 0 is low indicating a desire to not have PMOS transistor 410 activated for the medium slew rate.

The logic state of the NGATE 1 signal on line 492 in controlled by NOR gate 494 and the states of input signals DATA IN on line 214 and the OEN* signal on line 208. When OEN* is low indicating a desire for the output line 156 in FIGS. 7 and 11 to be enabled, the logic state of the NGATE 1 signal is controlled solely by the input data. This is because regardless of the slew rate, the NMOS transistor 404 will be active and will only be turned off for tristate mode when OEN* is high.

The logic state of NGATE 2 signal on line 496 is controlled by NOR gate 498 and NAND gate 500 and the logic states of input signals CSLEW 1 and the OEN* signal and the DATA IN signal. When OEN* is high indicating a desire to tristate the output line 156 in FIGS. 7 and 11, inverter 502 outputs a logic 0 which forces NAND gate 500 to output a logic 1 which forces NOR gate 498 to output a logic 0 which turns off NMOS gate 408 to tristate the output because PMOS transistor 406 in FIG. 11 of off for the same state of the input signals. When OEN* is low and CSLEW 1 is high, it is an indication that the driver is to be enabled in TTL mode or CGTL or CGTLP mode at a medium slew rate (regardless of whether TTL or CGTL mode is to be used, the NMOS transistors will be used). This state of the inputs causes the output of NOR gate 498 to be controlled by the DATA IN signal on line 214 thereby activating NMOS transistor 408 in FIG. 11 and causing it to drive output line 156 in accordance with the input data.

The logic state of NGATE 3 signal on line 502 is controlled by NOR gate 504 and NAND gate 506 and the logic states of input signals CSLEW 0 and the OEN* signal and the DATA IN signal. When OEN* is high indicating a desire to tristate the output line 156 in FIGS. 7 and 11, inverter 502 outputs a logic 0 which forces NAND gate 506 to output a logic 1 which forces NOR gate 504 to output a logic 0 regardless of the state of the DATA IN signal thereby turning off NMOS gate 412 to tristate the output because PMOS transistor 410 in FIG. 11 of off for the same state of the input signals. When OEN* is low and CSLEW 0 is high, it is an indication that the driver is to be enabled in TTL mode or CGTL or CGTLP mode at a fast slew rate (regardless of whether TTL or CGTL mode is to be used, the NMOS transistors will be used). This state of the inputs causes the output of NOR gate 504 to be controlled by the DATA IN signal on line 214 thereby activating NMOS transistor 412 in FIG. 11 and causing it to drive output line 156 in accordance with the input data.

The logic state of the NG-GTL signal on line 508 is controlled by the NOR gate 510 and the NAND gate 512 and the input signals DATA IN, OEN* and CGTL ON*. When OEN* is high indicating tristate mode is desired, inverter 502 outputs a 0 and NAND gate 512 outputs a logic 1 regardless of the state of the CGTL ON* signal. This forces NOR gate 510 to output a logic 0 regardless of the state of the DATA IN signal thereby turning off NMOS transistor 414 to tristate output line 156. When OEN* is low, NAND gate 512 outputs a signal which depends upon the state of the CGTL ON* signal. When the CGTL ON* signal is high, it indicates the driver is to be activated as a CGTL driver. When the CGTL ON* signal is high and OEN* is low, NAND gate 512 outputs a logic 0 which enables NOR gate 510 to drive the gate of NMOS transistor 414 in accordance with the state of the DATA IN signal to drive the output line 156 in FIG. 11 thereby emulating the structure and operation of the CGTL and CGTLP driver in FIG. 2.

By a straightforward modification of the logic of FIG. 12, it is possible to convert the driver of FIG. 11 to an AGTL, HSTL or SSTL driver operating like the driver in FIG. 6. To make this modification, it is necessary to re-gate the circuit of FIG. 12 so that the PGATE and NGATE signals are selectively turned on with the same logic levels and with the number of PGATE and NGATE signals being simultaneously so driven as to meet the drive requirements for Vol, Voh, currrent sink capability and current source capability. In the claims, the phrase "TTL or AGTL or HSTL or SSTL format output signals" means output signals generated at logic levels and with current sink and current source capability to meet a selected one of the TTL or AGTL or HSTL or SSTL specifications. As to the input circuits, the phrase "input signals having logic 1 and logic 0 voltage levels and reference levels which are characteristics of any of the TTL, GTL, GTLP, LPECL, or LVDS circuit families" in the claims means input signals having all the characteristics defined in the specifications of a selected one of the TTL, GTL, GTLP, LPECL, or LVDS circuit families.

Although the invention has been disclosed in terms of the preferred and alternative embodiments disclosed herein, those skilled in the art will appreciate possible alternative embodiments and other modifications to the teachings disclosed herein which do not depart from the spirit and scope of the invention. All such alternative embodiments and other modifications are intended to be included within the scope of the claims appended hereto.

What is claimed is:

1. An apparatus comprising:

first means for receiving data at a pin or external connection pad on a field programmable gate array using an input circuit which can be programmed to be compatible with either single-ended or differential input signals having logic 1 and logic 0 voltage levels and reference levels which are characteristics of a selected one of the TTL, GTL, GTLP, LPECL, or LVDS circuit families and converting said input signals to logic levels which are used in said field programmable gate array, said first means also having inputs for receiving control signals generated from programming bits which control whether said first means functions to convert TTL, GTL, GTLP, LPECL or LVDS format single-ended or differential input signals to logic signals at levels compatible with the internal circuitry of said field programmable gate array;

second means for receiving data generated within said field programmable gate array at logic levels used in said field programmable gate array and converting the logic levels of said data generated within said field programmable gate array to output data for driving said pin or external connection pad on a field programmable gate array, said output data having logic levels compatible with any of the TTL, GTL or GTLP circuit families, said second means being programmable by means of receiving input signals generated from programming bits said input signals controlling whether said second means functions to convert said logic levels of said data generated in said field programmable gate array to output data having logic levels and current source and sink characteristics compatible with a selected one of the TTL, GTL or GTLP circuit families; and enabling means within said first means and said second means for receiving said control signals generated from said programming bits and controlling said first means so as to define which type of input circuit said first means is to be and controlling said second means to determine which type of driver said second means is to be.

2. A programmable I/O apparatus for a field programmable gate array comprising:

a pin or pad at which are received input signals;

a first programmable input circuit having a data input coupled to said pin or pad and to a pair of CMOS transistors, for receiving TTL input signals from said pin or pad and using said pair of series connected CMOS transistors to convert the TTL logic levels of said TTL input signals to logic levels used internally in said field programmable gate array, and having a power down input for receiving a power down programming signal which has a first logic state which causes one or more power down transistors to disable said pair of CMOS transistors and a second logic state which causes said one or more power down transistors to enable said CMOS transistors to operate on said TTL input signals;

a second programmable input circuit having a data input coupled to said pin or pad and to a pair of differentially coupled PMOS transistors driving an NMOS output driver transistor which drives a CMOS tristate buffer, for receiving GTL or GTLP input signals from said pin or pad and using said pair of differentially connected PMOS transistors to convert the GTL or GTLP logic levels of said GTL or GTLP input signals to logic levels used internally in said field programmable gate array, and having a bias input for receiving a bias signal which controls the current level output by a current source feeding said differentially coupled PMOS transistors, and having a power down input for receiving a power down programming signal which has a first logic state which causes one or more power down transistors to disable said pair of differentially connected PMOS transistors, disable said NMOS output driver and place said CMOS trisate output buffer in tristate mode and a second logic state which causes said one or more power down transistors to enable said differentially coupled PMOS transistors, enable said NMOS output driver and cause said CMOS tristate output buffer to be enabled to operate on said GTL or GTLP input signals;

a third programmable input circuit having a data input coupled to said pin or pad and to a pair of differentially coupled NMOS transistors driving a PMOS output driver transistor which drives a CMOS tristate buffer, for receiving single ended or differential input LVPECL or LVDS signals from said pin or pad and using said pair of differentially connected NMOS transistors to convert the single ended or differential input LVPECL or LVDS signal logic levels of said input signals to logic levels used internally in said field programmable gate array, and having a bias input for receiving a bias signal which controls the current level output by a current source feeding said differentially coupled NMOS transistors, and having a power down input for receiving a power down programming signal which has a first logic state which causes one or more power down transistors to disable said pair of differentially connected NMOS transistors, and disable said PMOS output driver and place said CMOS trisate output buffer in tristate mode and a second logic state which causes said one or more power down transistors to enable said differentially coupled NMOS transistors, enable said NMOS output driver and enable said CMOS tristate output buffer to operate on said GTL or GTLP input signals; and a programmable TTL or GTL/GTLP driver having an output coupled to said pin or pad and having a data input to receive data generated in said field programmable gate array at logic levels used inside said field programmable gate array which are to be driven onto said pin or pad using TTL or GTL or GTL logic levels and drive requirements, said data input coupled to a plurality of pairs of parallel connected CMOS pairs used to generate TTL output signals at programmable slew rates and an NMOS transistor used to generate GTL or GTLP output signals, and hereafter referred to as the operative transistors, said data input coupled to said operative transistors through a network of enable and slew rate control gates which have a power down input for receiving a power down input generated from a programming bit, an input for receiving data generated from programming bits controlling the slew rate and an input for receiving an input signal generated from a programming bit which controls whether said driver is a TTL or GTL/GTLP driver, said enable and slew rate control gates generating from these input signals individual outputs coupled to the gates of said CMOS and NMOS transistors which control whether they function as a TTL driver or a GTL/GTLP driver and which control the slew rate.

3. An apparatus comprising:

first circuit for receiving data at a pin or external connection pad on a field programmable gate array using one or more input circuits comprised of CMOS pairs or differentially coupled NMOS pairs or differentially coupled PMOS pairs which can be selectively enabled and disabled in accordance with the state of control signals generated from programming bits to be compatible with input signals having logic 1 and logic 0 voltage levels and reference levels which are characteristics of a selected one of the TTL, GTL, GTLP, LPECL, or LVDS circuit families, said one or more input circuits functioning to convert said input signals to logic levels which are used in said field programmable gate array, said first circuit also having inputs for receiving control signals generated from programming bits which control which of said input circuits is enabled and disabled so as to control whether said first circuit functions to convert TTL, GTL, GTLP, LPECL or LVDS format input signals to logic signals at levels compatible with the internal circuitry of said field programmable gate array;

second circuit for receiving data generated within said field programmable gate array at logic levels used in said field programmable gate array and converting the logic levels of said data generated within said field programmable gate array to output data for driving said pin or external connection pad on a field programmable gate array, said output data having logic levels compatible with any of the TTL, GTL, GTLP, AGTL, HSTL or SSTL circuit families, said output data being generated using at least one pair of CMOS transistors which may be selectively enabled to generate TTL or AGTL or HSTL or SSTL format output signals at a selectable slew rate and using at least one NMOS transistor which may be selectively enabled to generate GTL or GTLP output signals, said second circuit being programmable by means of receiving control signals generated from programming bits said control signals controlling whether said second circuit functions to convert said logic levels of said data generated in said field programmable gate array to output data having logic levels and current source and sink characteristics compatible with a selected one of the TTL, GTL, GTLP, AGTL, HSTL or SSTL circuit families using a network of enable and slew rate control gates which receive said data generated within said field programmable gate array and said control signals and generates a plurality of individual gate control signals which control the gates of the transistors in said at least one CMOS pair and said at least one NMOS transistor to implement the desired driver type.

4. An apparatus comprising:

a first circuit for receiving data at a pin or external connection pad on a field programmable gate array using one or more input circuits comprised of CMOS pairs or differentially coupled NMOS pairs or differentially coupled PMOS pairs which can be selectively enabled and disabled in accordance with the state of control signals generated from programming bits to be compatible with either single-ended or differential input signals having logic 1 and logic 0 voltage levels and reference levels which are characteristics of a selected one of the TTL, GTL, GTLP, LPECL, or LVDS circuit families, said one or more input circuits functioning to convert said single-ended or differential input signals to logic levels which are used in said field programmable gate array, said first circuit also having inputs for receiving control signals generated from programming bits that control which of said input circuits is enabled and disabled so as to control whether said first circuit functions to convert TTL, GTL, GTLP, LPECL or LVDS format single-ended or differential input signals to logic signals at levels compatible with the internal circuitry of said field programmable gate array;

a second circuit for receiving data generated within said field programmable gate array at logic levels used in said field programmable gate array and converting the logic levels of said data generated within said field programmable gate array to output data for driving said pin or external connection pad on a field programmable gate array, said output data having logic levels compatible with any of the TTL, GTL, GTLP, AGTL, HSTL or SSTL circuit families, said output data being generated using at least one pair of CMOS transistors which may be selectively enabled to generate TTL or AGTL or HSTL or SSTL format output signals or using at least one NMOS transistor which may be selectively enabled in accordance with the state of a programming bit to generate GTL or GTLP format output signals.

5. An I/O circuit for an integrated circuit device compatible with a plurality of technology families comprising:

a level shifting circuit for shifting between high and low voltage levels used by the integrated circuit device and a plurality of high and low voltage levels used by an external device connected to the integrated circuit device, the level shifting circuit comprising:

an input terminal for receiving an input signal;

a reference terminal for receiving one of:
  a reference signal characteristic of a selected one of the technology families when the one of the technology families is single-ended, and
  a complement of the input signal when the technology family uses differential input signals; and programming structure for connecting one of the reference signal and the complement of the input signal to the reference terminal.

* * * * *